United States Patent [19]

Kurihara et al.

[11] Patent Number: 4,761,325
[45] Date of Patent: Aug. 2, 1988

[54] MULTILAYER CERAMIC CIRCUIT BOARD

[75] Inventors: Kazuaki Kurihara, Atsugi; Nobuo Kamehara, Isehara; Hiromitsu Yokoyama, Sagamihara; Hiromi Ogawa, Yokohama; Kishio Yokouchi, Zama; Yoshihiko Imanaka, Atsugi; Koichi Niwa, Tama, all of Japan

[73] Assignee: Fujitsu Limited, Kawasaki, Japan

[21] Appl. No.: 762,310

[22] Filed: Aug. 2, 1985

[30] Foreign Application Priority Data

May 31, 1984 [JP] Japan ................................. 59-109490

[51] Int. Cl.$^4$ ................................................ B32B 3/00
[52] U.S. Cl. .................................... 428/209; 428/325; 428/210; 428/432; 428/901
[58] Field of Search .............. 428/901, 137, 209, 210, 428/325, 432; 427/96

[56] References Cited

U.S. PATENT DOCUMENTS

| | | | |
|---|---|---|---|
| 4,234,367 | 11/1980 | Herron et al. | 427/96 X |
| 4,465,727 | 8/1984 | Fujita et al. | 428/901 X |
| 4,490,429 | 12/1984 | Tosaki et al. | 428/210 X |
| 4,504,339 | 3/1985 | Kamehara et al. | 427/96 X |
| 4,536,435 | 8/1985 | Utsumi et al. | 428/901 X |
| 4,609,582 | 9/1986 | Joormann et al. | 428/209 X |

FOREIGN PATENT DOCUMENTS 59-11700 1/1984 Japan .

Primary Examiner—Nancy A. B. Swisher
Attorney, Agent, or Firm—Staas & Halsey

[57] ABSTRACT

A method for producing a multilayer ceramic circuit board including the steps of forming a multilayer structure consisting of patterns of copper-based paste and glass-ceramic layers, the glass-ceramic layers consisting of a mixture of 10 percent to 75 percent by weight of α-alumina, 20 percent to 60 percent by weight of crystallizable or noncrystallizable glass which can be sintered at a temperature lower than the melting point of copper, and 5 percent to 70 percent by weight of quartz glass, based on the total weight of the glass-ceramic, blended with a binder containing a thermally depolymerizable resin; prefiring the multilayer structure in an inert atmosphere containing water vapor, the partial pressure of which is 0.005 to 0.3 atmosphere, at a temperature where the thermally depolymerizable resin is eliminated; and firing the multilayer structure in an inert atmosphere containing no water vapor at a temperature below the melting point of copper so as to sinter the glass-ceramic.

20 Claims, 17 Drawing Sheets

RELATIONSHIP BETWEEN DIELECTRIC CONSTANT
AND AMOUNT OF GLASS

O : GLASS IN α-ALUMINA-GLASS SYSTEM

△ : GLASS IN α-ALUMINA-33Wt% QUARTZ GLASS -GLASS SYSTEM

RELATIONSHIP BETWEEN DIELECTRIC CONSTANT AND AMOUNT OF GLASS

○ : GLASS IN α-ALUMINA-GLASS SYSTEM

△ : GLASS IN α-ALUMINA-33Wt% QUARTZ GLASS -GLASS SYSTEM

RELATIONSHIP BETWEEN RESIDUAL CARBON AND AMOUNT OF GLASS

○: GLASS IN α-ALUMINA - GLASS SYSTEM

△: GLASS IN α-ALUMINA - 33 Wt % QUARTZ GLASS - GLASS SYSTEM

RELATIONSHIP BETWEEN BENDING STRENGTH (KG/CM²) AND WEIGHT RATIO IN α-ALUMINA-QUARTZ GLASS - GLASS SYSTEM

RELATIONSHIP BETWEEN DENSITY AND
AMOUNT OF GLASS IN α-ALUMINA-GLASS SYSTEM

RELATIONSHIP BETWEEN INSULATION VOLTAGE AND RESIDUAL CARBON

WEIGHT RATIO IN α-ALUMINA-QUARTZ GLASS -GLASS SYSTEM

RELATIONSHIP BETWEEN RESIDUAL CARBON AND PREFIRING TEMPERATURE

PREFIRING AND FIRING PROFILE

SIGNAL LAYER OF MULTILAYERED CIRCUIT BOARD

Fig. 10

LAYER STRUCTURE OF COPPER CONDUCTOR MULTILAYERED CIRCUIT BOARD

| LAYER STRUCTURE | SHEET LAYER | PATTERN |
|---|---|---|
| | 1 | SURFACE |
| | 3 | SIGNAL |
| | | GROUND |
| | 5 | SIGNAL |
| | 7 | POWER SUPPLY |
| | 9 | SIGNAL |
| | 11 | I/O |

RELATIONSHIP BETWEEN FIRED DENSITY AND FIRING TEMPERATURE

FIRED DENSITY CHANGE AS A FUNCTION OF FIRING TEMPERATURE AND FIRING TIME

RELATIONSHIP BETWEEN WATER ABSORPTION AND FIRING TIME OF SiO₂ GLASS ADDED GLASS-CERAMIC

RELATIONSHIP BETWEEN SURFACE ROUGHNESS AND FIRING TIME OF SiO GLASS ADDED GLASS-CERAMIC

RELATIONSHIP BETWEEN WATER ABSORPTION AND FIRED DENSITY OF $SiO_2$ GLASS ADDED GLASS-CERAMIC

RELATIONSHIP BETWEEN SURFACE ROUGHNESS AND FIRED DENSITY OF $SiO_2$ GLASS ADDED GLASS-CERAMIC

MULTILAYER CERAMIC CIRCUIT BOARD

BACKGROUND OF THE INVENTION

1. Field of the Invention

The present invention relates to a method for producing a multilayer ceramic circuit board, and more particularly a method for producing a circuit board comprising a glass-ceramic having a low dielectric constant and copper conductors having a low electrical resistivity, enabling high-speed signal transmission.

2. Description of the Related Art

A multilayer circuit board consists of layers of electrical insulators, usually ceramic, and metallic conductors. The ceramic must have a low dielectric constant as well as a high electrical resistivity, high bending strength, low thermal expansion coefficient, and high thermal conductivity. The metallic conductor is preferably copper due to its low electrical resistivity and price. During the firing of the multilayer board, the organic binder included in the ceramic must be decomposed without any residual carbon and the copper must not be oxidized.

U.S. Pat. No. 4,234,367 to Herron et al., assigned to IBM, discloses a method of making multilayer glass structures having an internal distribution of copper-based conductors by firing in a controlled ambient atmosphere of $H_2$: $H_2O = 10^{-4}$ to $10^{-6.5}$, at a temperature below the melting point of copper. In this method, $\beta$-spoduemene or cordierite is preferably used as the crystallizable glass. It is, however, difficult to control the ambient atmosphere, due to the extraordinarily small amount of the hydrogen content.

U.S. Pat. No. 4,504,339 to Kamehara et al., assigned to Fujitsu Limited, discloses a method for producing a multilayer glass-ceramic structure having copper-based conductors therein for use as a circuit board. In this method, a multilayer structure comprises layers of a thermally depolymerizable resin and glass-ceramic containing preferably 40 percent to 60 percent by weight of $Al_2O_3$ and layers of a copper-based paste. The structure is fired in an inert atmosphere containing water vapor, the partial pressure of which is 0.005 to 0.3 atmosphere, preferably at 550° C. to 650° C. The structure is then sintered in a nitrogen atmosphere containing no water vapor, preferably at about 900° C. However, if the firing temperature in the inert atmosphere containing water vapor is higher than 650° C., the residual carbon is trapped in the closed pores in which $H_2O$ vapor is present. The carbon then reacts with the $H_2O$ to form $CO_2$. This phenomenon results in bloating of the glass-ceramic.

Japanese Unexamined Patent Publication (Kokai) No. 59-11700 to Ogihara et al., assigned to Hitachi, discloses a multilayer ceramic circuit board obtained by firing a mixture of silica and a noncrystallizable glass in an atmosphere containing nitrogen, hydrogen, and water vapor. However, the bending strength of the board is inevitably lower than that of one formed with crystalline ceramics.

SUMMARY OF THE INVENTION

It is an object of the present invention to produce a multilayer ceramic circuit board having only a very small amount of residual carbon from the binder of the ceramic, even after firing at a high temperature.

It is another object of the present invention to produce a multilayer ceramic circuit board employing ceramic having a high bending strength and a low thermal expansion coefficient.

It is still another object of the present invention to produce a multilayer ceramic circuit board having low water absorption and low surface roughness.

It is yet another object of the present invention to produce a multilayer ceramic circuit board having a low dielectric constant, a low electrical resistivity, and a low delay time without reducing the dielectric strength.

According to the present invention, there is provided a method for producing a multilayer ceramic circuit board comprising the steps of forming a multilayer structure having patterns of copper-based paste and glass-ceramic layers, the glass-ceramic layers consisting of a mixture of 10 percent to 75 percent by weight of $\alpha$-alumina, 20 percent to 60 percent by weight of crystallizable or noncrystallizable glass (the term "noncrystallizable glass" or "glass" as used in this specification excludes quartz glass) which can be sintered at a temperature lower than the melting point of copper, and 5 percent to 70 percent by weight of quartz glass, based on the total weight of the ceramic, blended with a binder containing a thermally depolymerizable resin; prefiring the multilayer structure in an inert atmosphere containing water vapor, the partial pressure of which is 0.005 to 0.3 atmosphere, at a temperature at which the thermally depolymerizable resin is eliminated; and firing the multilayer structure in an inert atmosphere containing no water vapor at a temperature below the melting point of copper so as to sinter the glass-ceramic.

It is desirable that the crystallizable glass be cordierite or spoduemene.

It is preferable that the noncrystallizable glass be borosilicate glass or aluminosilicate glass.

It is advantageous that the thermally depolymerizable resin be polymethacrylate ester, polytetrofluoroethylene, poly-$\alpha$-methylstyrene, or a mixture thereof.

It is useful that the prefiring be carried out in two steps, at 350° C. to 450° C. in the first step and at 650° C. to 900° C. in the second step, and that the final firing be carried out at a temperature higher than 900° C. and lower than 1083° C.

The multilayer structure may be formed by means of the laminated green sheet technique or the multilayer screen printing technique and exhibits the same mechanical and electrical properties after firing regardless of the forming procedure.

BRIEF EXPLANATION OF THE DRAWINGS

The present invention will be described in more detail below with reference to the appended drawings, in which:

FIG. 10 is an exploded side view of a layer structure of a copper conductor multilayer circuit board;

DESCRIPTION OF THE PREFERRED EMBODIMENTS

Generally, a circuit board should have a high bending strength, a low dielectric constant, and a high softening point and, thus, a low amount of residual carbon.

Usually, a glass-ceramic board is obtained by firing a mixture of α-alumina and noncrystallizable glass or crystallizable glass (hereinafter referred to as just "glass") blended with an organic binder. It is important that α-alumina and glass exhibit opposite dielectric constant, bending strength, and softening point characteristics, as shown in Table 1.

The glass component is useful in sintering the glass-ceramic and lowering the dielectric constant. Glass, however, lowers the softening point, which leads to an increase in the amount of residual carbon.

TABLE 1

|  | α-alumina | Glass | Quartz glass |
| --- | --- | --- | --- |
| Dielectric constant | 10.0 | 4 to 8 | 3.8 |
| Softening point (°C.) | mp 2015 | ca. 700 to 900 | ca. 1500 |
| Bending strength (kg/cm$^2$) | ca. 7000 | ca. 400 to 700 | ca. 600 |

Figure 1:
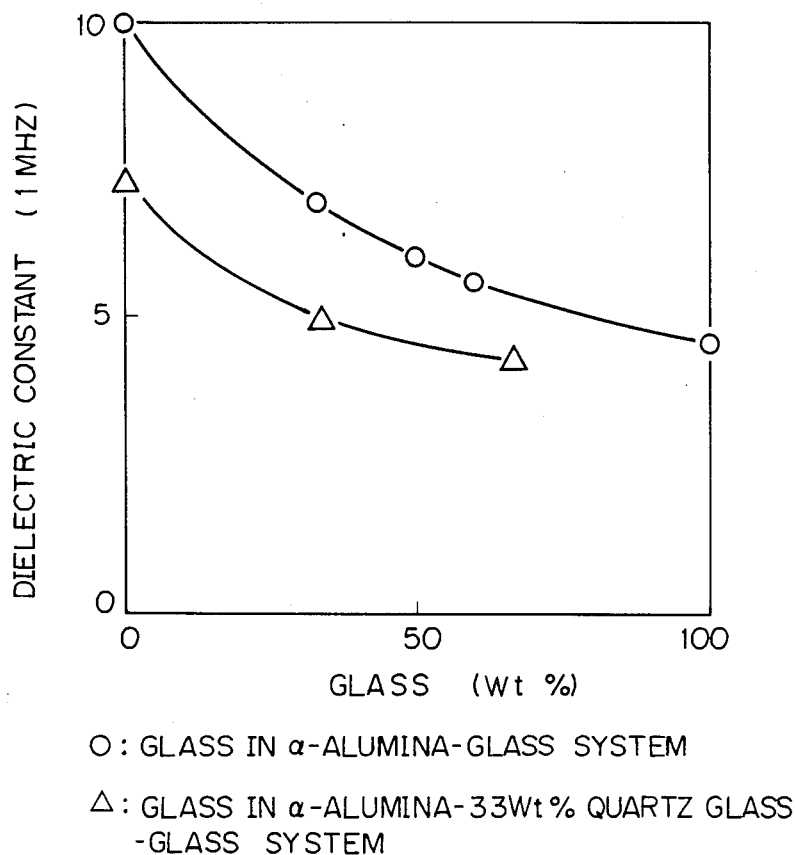
FIG. 1 show the relationship between the dielectric constant and the amount of glass added.
Figure 2:
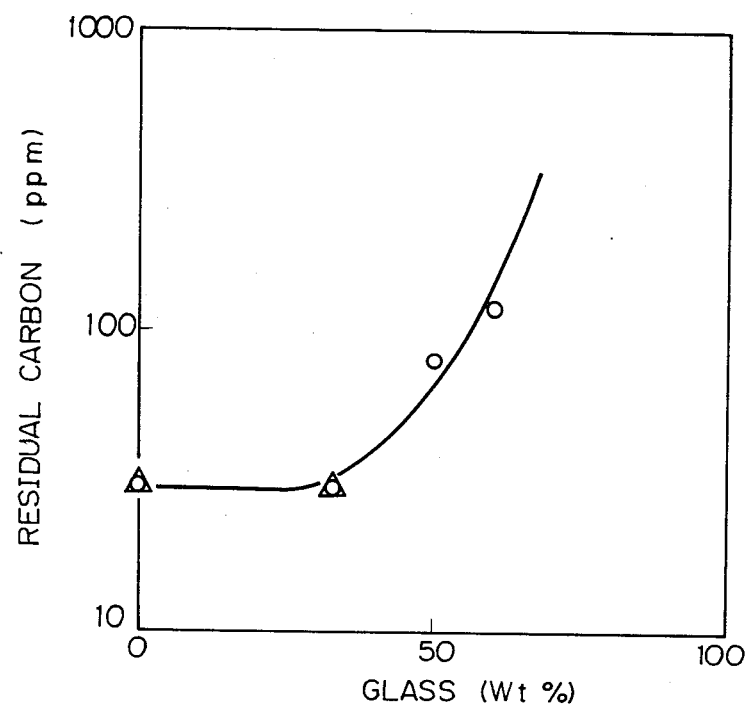
FIG. 2 shows the relationship between the residual carbon and amount of glass added.

According to the present invention, a certain amount of quartz glass with a low dielectric constant and a high softening point is added to the mixture of α-alumina and glass so as to lower the dielectric constant (FIG. 1) and raise the softening point. This makes it possible to eliminate the binder at a high temperature and compensates for the unfavorable effect of the glass, i.e., decreases the amount of the residual carbon (FIG. 2).

Addition of too large an amount of quartz glass, which has a low bending strength, however, would lower the bending strength of the glass-ceramic, which contains α-alumina and glass.

Figure 3:
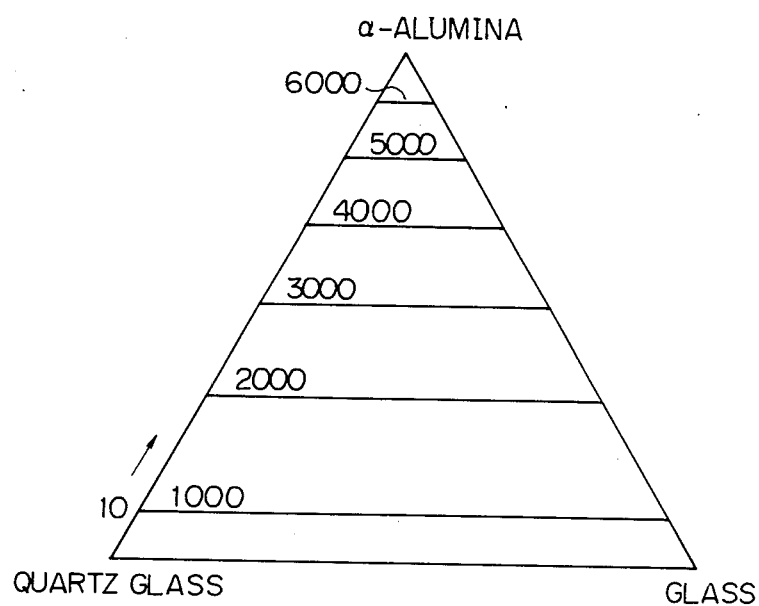
FIG. 3 shows the relationship between the bending strength and the weight ratio in an $\alpha$-alumina/quartz-glass/glass system.

The relationship between the bending strength and weight ratio in an α-alumina/quartz-glass/glass system (FIG. 3) is obtained from the following general formula of three components.

$$\sigma = \left( \sigma_1 \frac{w_1}{\rho_1} + \sigma_2 \frac{w_2}{\rho_2} + \sigma_3 \frac{w_3}{\rho_3} \right) /$$

$$\left( \frac{w_1}{\rho_1} + \frac{w_2}{\rho_2} + \frac{w_3}{\rho_3} \right)$$

σ: Bending strength
w: Weight ratio
ρ: Density

A ceramic circuit board should exhibit a bending strength of up to 1000 kg/cm$^2$. Thus, the weight ratio of α-alumina must be at least 10 percent.

Figure 4:
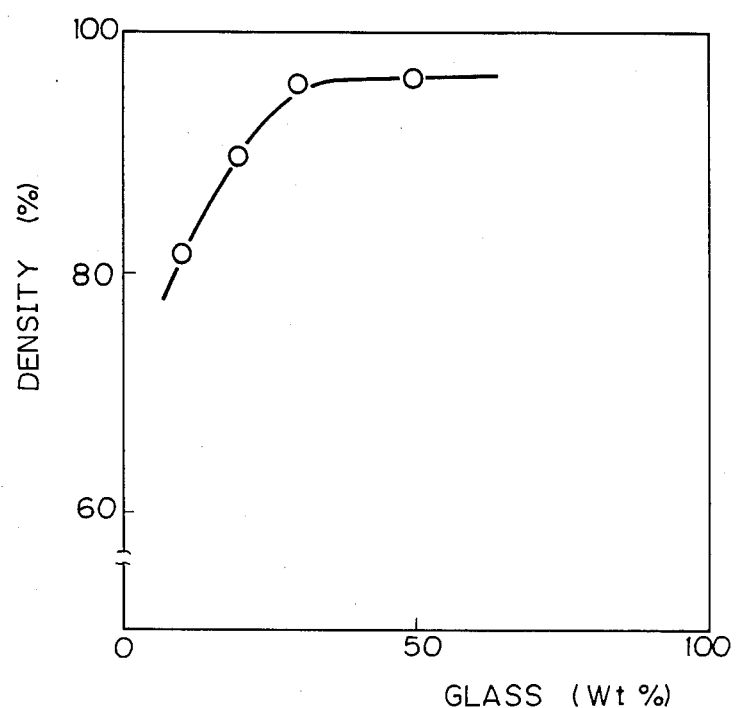
FIG. 4 shows the relationship between density and the amount of glass added in an $\alpha$-alumina/glass system.

Generally, a glass-ceramic increases in density when the constituent amount of glass is increased (FIG. 4). The figure shows the density of an α-alumina/quartz-glass/borosilicate-glass system, sintered at 1050° C. for two hours.

A circuit board should have a density of at least 90 percent, so it is necessary to add at least 20 percent by weight of glass, such as borosilicate glass.

Figure 5:
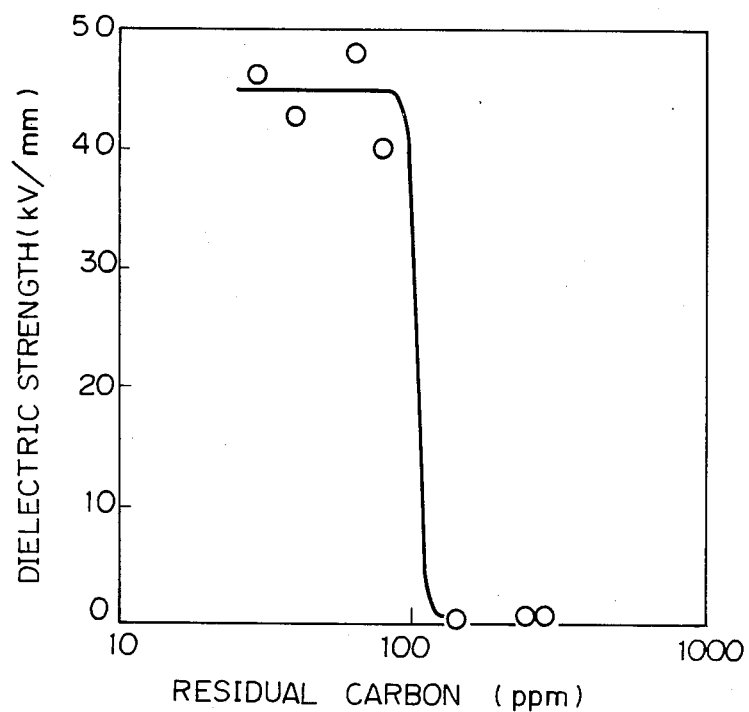
FIG. 5 shows the relationship between the dielectric strength and residual carbon.

Residual carbon results from the carbon material in closed pores formed in a glass-ceramic prior to elimination of the binder. This will be clear from the previous description, i.e., the addition of a large amount of glass lowers the sintering temperature of the glass-ceramic and increases the amount of residual carbon (FIG. 2). The increase of residual carbon leads to a lower dielectric strength. In order to maintain the dielectric strength at a desirable value, the residual carbon should be as low as 100 ppm (FIG. 5). Turning back to FIG. 2, the glass-ceramic should have up to 60 percent by weight of glass.

Figure 6:
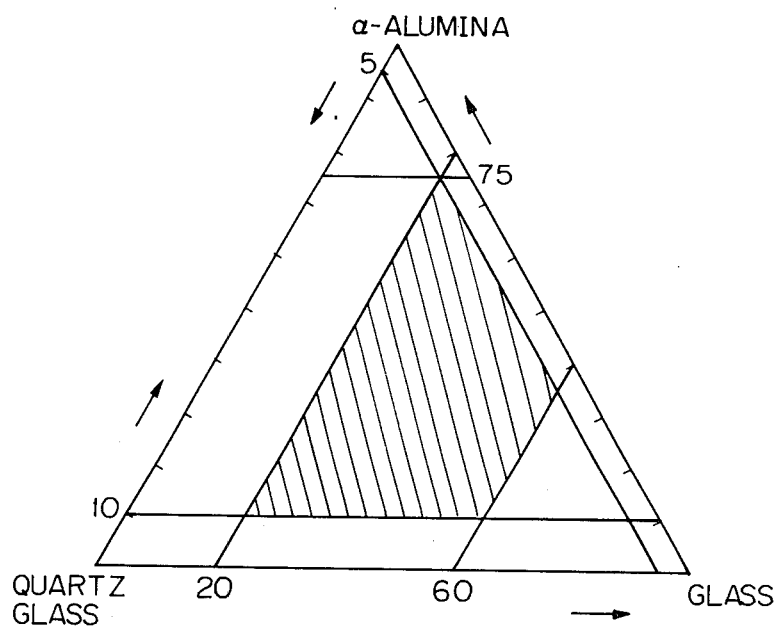
FIG. 6 shows the weight ratio in an $\alpha$-alumina/quartz-glass/glass system.

In summary, as to the weight ratio of the three components of the glass-ceramic, there should be at least 10 percent by weight of α-alumina and 20 percent to 60 percent by weight of glass. These limitations fall in the hatched area of FIG. 6. Consequently, the upper limit of the weight ratio of α-alumina is determined as 75 percent. The upper limit of the quartz glass is determined as 70 percent from the balance of the sum of the lower limits of α-alumina and glass. The lower limit of quartz glass is determined to be 5 percent because sufficient effects are not obtained with quartz glass of under 5 percent.

The resin used to bind the glass-ceramic should be a thermally depolymerizable resin, preferably polymethacrylate ester, polytetrafluoroethylene, poly-α-methylstyrene, or a mixture thereof. The multilayer ceramic circuit board, which comprises, prior to firing, layers of ceramic blended with one of these thermally depolymerizable resins and patterns of copper-based paste, is prefired in an inert atmosphere containing water vapor, the partial pressure of which is 0.005 to 0.3 atmosphere, at a temperature at which the thermally depolymerizable resin is eliminated and thereafter is subjected to final firing in an inert atmosphere containing no water vapor at a temperature below the melting point of copper, at which the glass-ceramic is sintered.

The prefiring step may comprise two steps for eliminating the binder resin in the inert atmosphere containing water vapor. In a first step, the binder resin is thermally depolymerized at a temperature lower than 500° C. In the second step, the residual organic substance which was not depolymerized in the first step reacts with water vapor at a temperature higher than 500° C.

Figure 7:
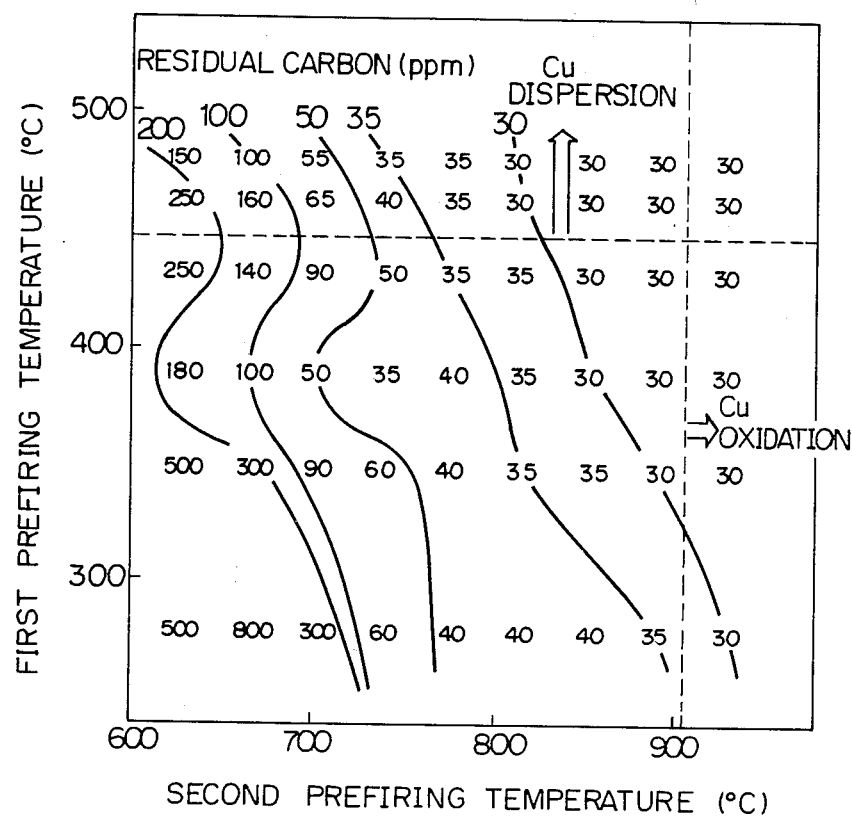
FIG. 7 shows the relationship between residual carbon and the prefiring temperature.

A glass-ceramic composition including α-alumina, quartz glass, and borosilicate glass, each in an amount of about 33 percent, based on the total weight of glass-ceramic, was subjected to prefiring. The relationship of the first prefiring temperature, predetermined as 280° C. to 480° C. for 8 hours, the second prefiring temperature, predetermined as 600° C. to 925° C. for 8 hours, the amount of residual carbon, and the chemical and physical behavior of copper was investigated. The results are shown in FIG. 7. The numerals plotted in the figure represent the amount of residual carbon. Their contour lines are drawn between the plotted points having equivalent numerals.

The first prefiring step produces minimal residual carbon at a temperature between 350° C. to 450° C., while the second prefiring step produces less than 100 ppm of residual carbon at a temperature of 650° C. or more. On the other hand, copper diffuses in the glass-ceramic structure at a temperature higher than 450° C. in the first prefiring step, and oxidation of copper is observed at a temperature higher than 900° C. in the second prefired step.

Therefore, the elimination of the thermally depolymerizable resin is preferably carried out at temperature of 350° C. to 450° C. in the first prefiring step and 650° C. to 900° C. in the second prefiring step.

Figure 8:
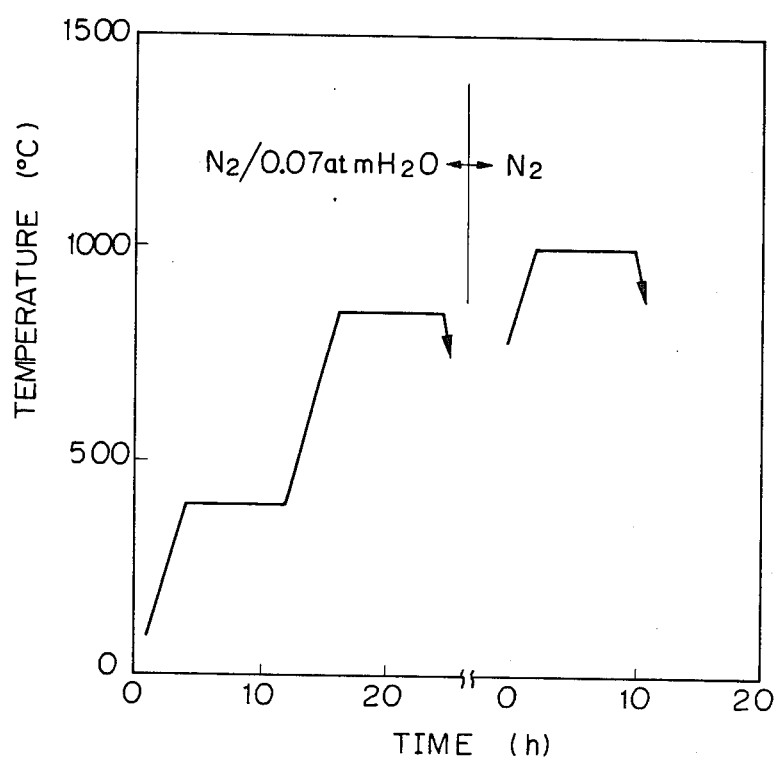
FIG. 8 shows the prefiring and firing profile.

After eliminating the thermally depolymerizable resin, the glass-ceramic structure is heated in an inert atmosphere without water vapor at a temperature lower than the melting point of copper, thereby sintering the glass-ceramic and thus increasing the density of the structure. The prefiring and firing profile is shown in FIG. 8.

The silica glass-containing glass ceramic circuit board according to the present invention exhibits excellent mechanical and electrical properties, i.e., a high bending strength, a low thermal expansion coefficient, a low residual carbon level, a high fired density, a low water absorption, a low dielectric constant, and a short delay time and can use a copper conductor having a low electrical resistivity. For example, the fired density may be 99 percent, the water absorption 0.05 percent, and the dielectric constant one-half and the delay time two-thirds of those of a conventional α-alumina circuit board.

The present invention will now be further illustrated by way of examples and comparative examples, which by no means are meant to limit the scope of the invention.

EXAMPLE 1

A glass-ceramic multilayer structure was prepared by the multilayer screen printing process. α-alumina (Alcoa A-14), quartz glass (Corning 7913), and borosilicate glass (Corning 7740) were mixed each in a weight ratio of 29.3 percent, i.e., each about 33 percent based on the total weight of glass-ceramic, and blended with a binder comprising 8.7 percent by weight of polymethacrylate ester resin and 3.3 percent by weight of dibutyl phthalate to form a glass-ceramic green sheet.

Signal layers were produced by printing copper paste (ESL 2310), to form conductor patterns, on green sheets (0.3×150×150 mm) formed by the doctor blade technique. In the green sheets, copper balls (0.2 mmφ) were vertically embedded to form via-holes. Thirty layers were laminated and pressed with a force of 25 MPa at 130° C. for 30 minutes.

The multilayer structure was then subjected to prefiring and final firing. The firing conditions and the mechanical and electrical properties of the obtained glass-ceramic and copper are shown in Table 2.

The mechanical and electrical properties of the glass-ceramic were found to depend on those of the components before mixing, rather than the analytical composition of the obtained glass-ceramic. This is because the α-alumina and quartz glass neither melt nor soften at firing temperatures below the melting point of copper and maintain their original properties even after the firing and also the amount of added α-alumina and quartz glass controls the properties of the obtained glass-ceramic.

TABLE 2

|  | Examples | | | | |
| --- | --- | --- | --- | --- | --- |
|  | 1 | 1a | 1b | 2 | 2a |
| Components (wt %) | | | | | |
| α-alumina | 34 | 50 | 50 | 34 | 50 |
| Quartz glass | 33 | 0 | 0 | 33 | 0 |
| Borosilicate glass | 33 | 50 | 50 | 0 | 0 |
| β-spoduemene | 0 | 0 | 0 | 33 | 50 |
| Prefiring | | | | | |
| First | | | | | |
| Temperature (°C.) | 400 | none | 400 | 400 | none |
| Time (h) | 8 | none | 8 | 8 | none |
| Second | | | | | |
| Temperature (°C.) | 800 | 650 | 800 | 800 | 700 |
| Time (h) | 8 | 4 | 8 | 8 | 4 |
| Firing | | | | | |
| Temperature (°C.) | 1010 | 950 | 950 | 1010 | 990 |
| Time (h) | 8 | 2 | 2 | 8 | 2 |
| Density (%) | 99 | 96 | 87 | 98 | 96 |
| Residual carbon (ppm) | 35 | 80 | 60 | 30 | 70 |
| Dielectric strength (kV/cm) | 50 | 50 | — | — | — |
| Dielectric constant (/MHz) | 4.9 | 5.6 | 4.8 | 5.3 | 6.0 |
| Delay time (ps/cm) | 75 | 82 | — | — | — |
| Bending strength (kg/cm$^2$) | 1800 | 2000 | 1200 | 1800 | 2000 |
| Thermal expansion coefficient X 10$^6$(1/°C.) | 3.0 | 4.5 | — | 3.5 | 7.0 |
| Copper conductor | — | — | Broken | — | — |
| Impedance (Ω) | 95 | 96 | — | — | — |

COMPARATIVE EXAMPLES 1a and 1b

The same procedure was carried out as in Example 1, except that the composition was modified to be 50 percent by weight of α-alumina and 50 percent by weight of borosilicate glass, based on the total weight of the glass-ceramic, and the firing conditions were changed. The obtained glass-ceramic circuit board of Example 1a exhibited a dielectric constant higher than that of Example 1; on the other hand, the obtained glass-ceramic circuit board of Example 1b exhibited a dielectric constant lower than that of Example 1, and the reliability (such as strength or water absorption) is degraded by the low density as reported in Table 2. Therefore, the ceramic of Example 1b is not deemed suitable for use as a ceramic circuit board.

EXAMPLE 2

The same procedure was carried out as in Example 1, except that β-spodumene was added instead of borosilicate glass. The glass-ceramic exhibited properties like those in Example 1.

COMPARATIVE EXAMPLE 2a

The same procedure was carried out as in Example 2, except that quartz glass was omitted from the composition and the firing conditions were modified. The obtained glass-ceramic circuit board exhibited a dielectric constant higher than that of Example 2.

The method for producing a multilayer ceramic board according to the present invention results in a lower dielectric constant without an increased amount of residual carbon and in addition results in improved reliability of the board and increased speed of signal transmission.

EXAMPLE 3

A green sheet of 0.34±0.01 mm thickness was produced by the doctor-blade technique from a slurry of a glass-ceramic mixture, having an average particle size in the range of 2 to 6 microns, of α-alumina (Alcoa A-14), quartz glass (Corning 7913), and borosilicate glass (Corning 7740), blended with a binder comprising an acrylic resin and di-butyl phthalate in a weight ratio shown in Table 3.

TABLE 3

Component of SiO$_2$ Glass Added Glass-Ceramic

| Component | Weight percent |
| --- | --- |
| α-Alumina (ALCOA A-14) | 25.7 |
| Borosilicate glass (Corning 7740) | 25.7 |
| Silica glass (Corning 7913) | 25.7 |
| Acrylic resin | 15.3 |
| Di-butyl phthalate | 7.6 |

Figure 9:
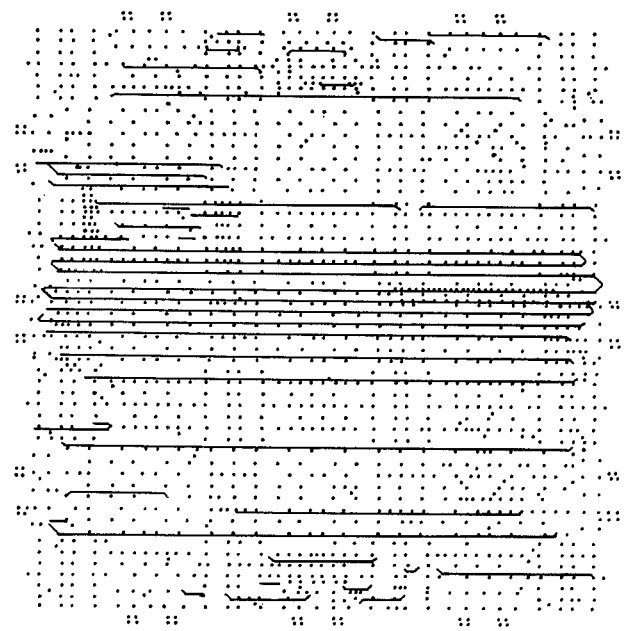
FIG. 9 is a plan view of a signal layer of a multilayer circuit board.

Minute copper balls were filled through the green sheet to form via-holes. A copper paste was printed on the surface of the green sheet to form a copper conductor pattern. A signal layer is shown as an example in FIG. 9, in which the dots represent via-holes and the straight lines represent signal patterns. In the same way as the signal layer, various patterns, i.e., a power supply, a ground, and an input/output pattern, were printed on corresponding green sheets, as shown in FIG. 10. These green sheets were laminated under 25 MPa at 130° C. to form an 11-layered laminate. Needless to say, these green sheets may be laminated to form much more than 11 layers, e.g., may be laminated to form 30 layers.

The produced quartz glass-containing α-alumina borosilicate glass-ceramic laminates were fired at various temperatures for various periods in an atmosphere of nitrogen containing less than 5 ppm of oxygen and less than 5 ppm of water vapor in order to determine the optimum range of firing conditions for obtaining the desirable mechanical and electrical performances of a circuit board without disadvantageous effects on the copper conductor.

Figure 11:
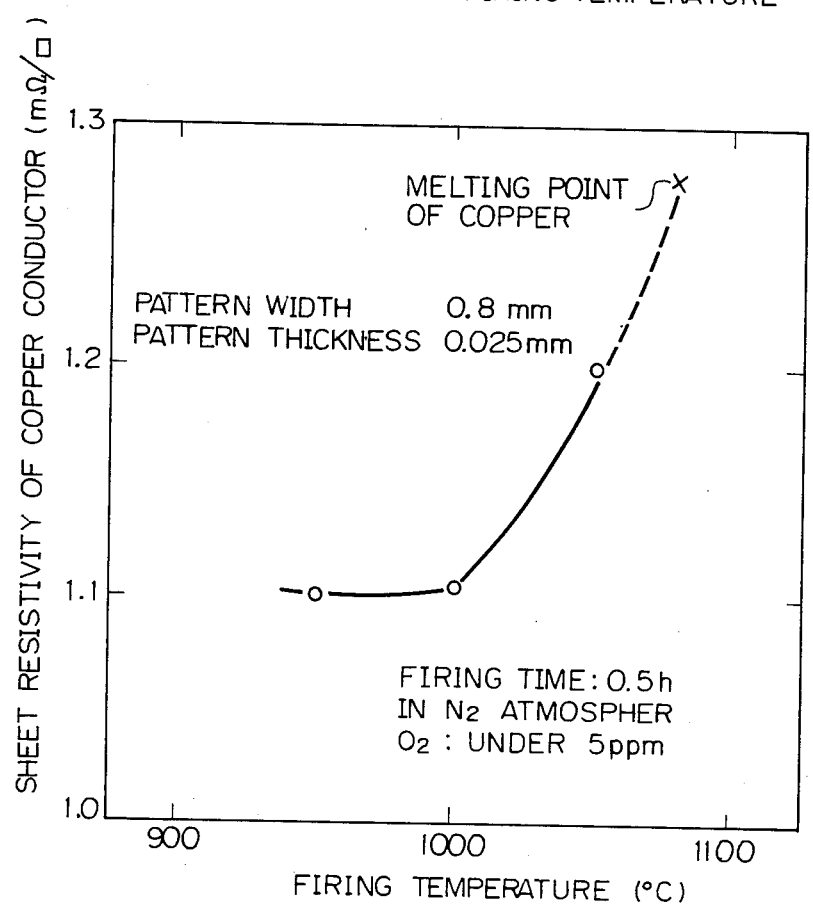
FIG. 11 shows the relationship between the electric sheet resistivity of the copper conductor and the firing temperature.

FIG. 11 shows the relationship between the sheet resistivity of a copper conductor with a width and a thickness of 0.8 mm and 0.025 mm, respectively, formed on an internal ceramic layer, and temperature, as fired for 30 minutes. The sheet resistivity is lowest at 1.1 m Ω/□ at a firing temperature of 950° C. to 1000° C. and increases up to 1.2 m Ω/□ at higher temperatures. The patterned circuit broke after firing at the melting point of copper. Therefore, the firing temperature is desirably not higher than 1083° C. of the melting point of copper.

Figure 12:
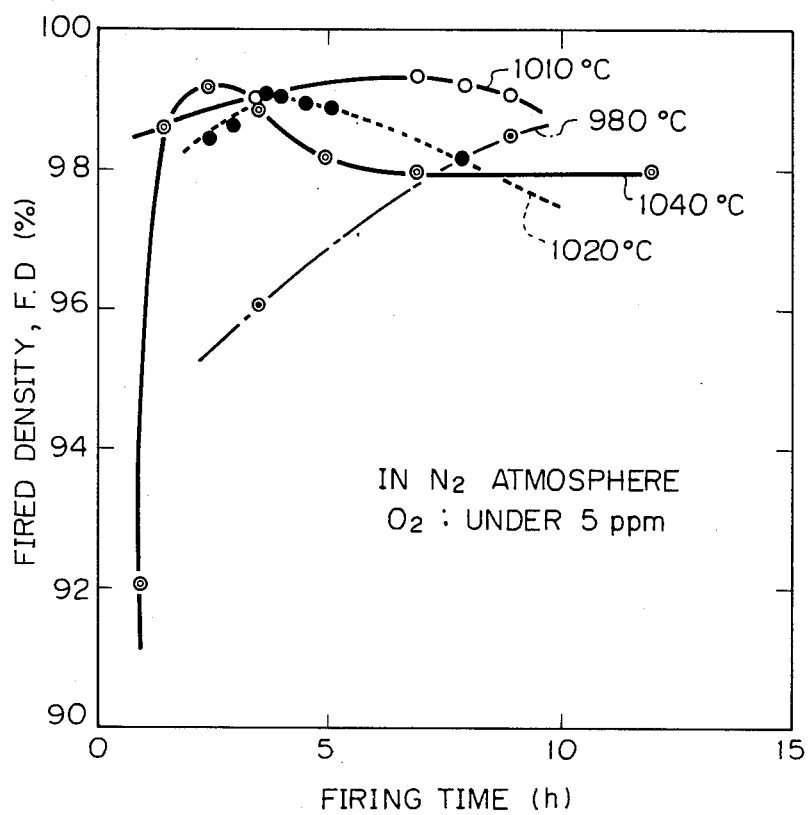
FIG. 12 shows the relationship between the fired density and firing temperature.

FIG. 12 shows the relationship between the fired density of a fired green sheet laminate of 2.72 mm thickness and firing periods of various temperatures. The thickness was reduced to about two-thirds of the original by the firing.

Figure 13:
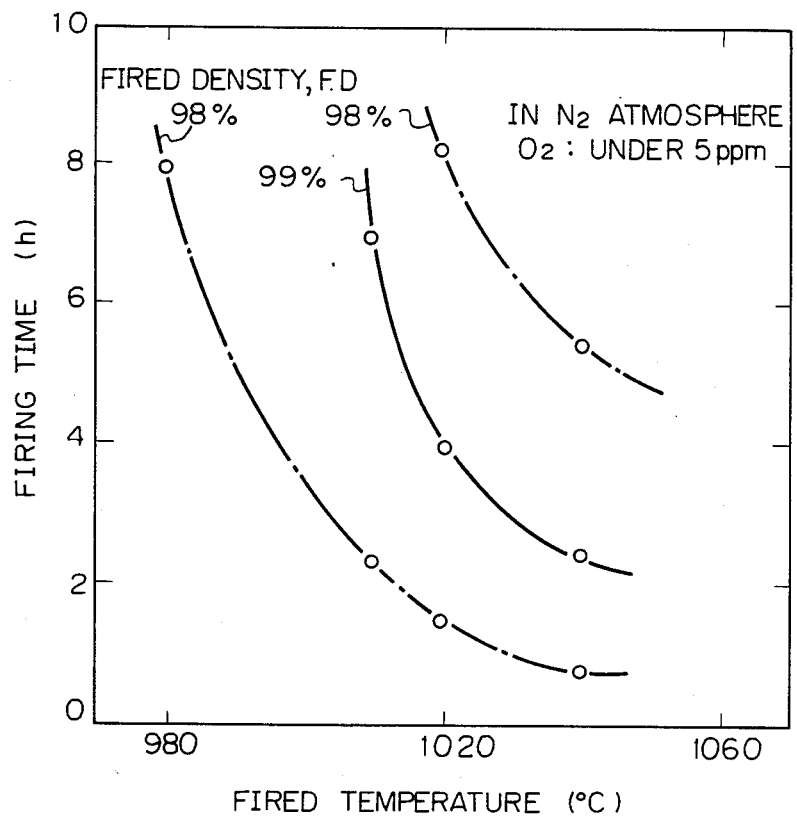
FIG. 13 shows the change of fired density as a function of the firing temperature and firing time.

FIG. 13 shows curves obtained from the same data plotted in FIG. 12. The fired density was calculated from the following equation:

$$FD(\%) = Gs/Dt \times 100$$

where Gs is the bulk density and Dt is the theoretical density. The bulk density was determined according to Japanese Industrial Standard (JIS) C 2141. The fired density reaches a maximum value in a short firing period. The higher the temperature, the shorter that firing period. The fired density reaches 99 percent after 8 hours at 1010° C., 4 hours at 1020° C., or 2 hours at 1040° C.

Figure 14:
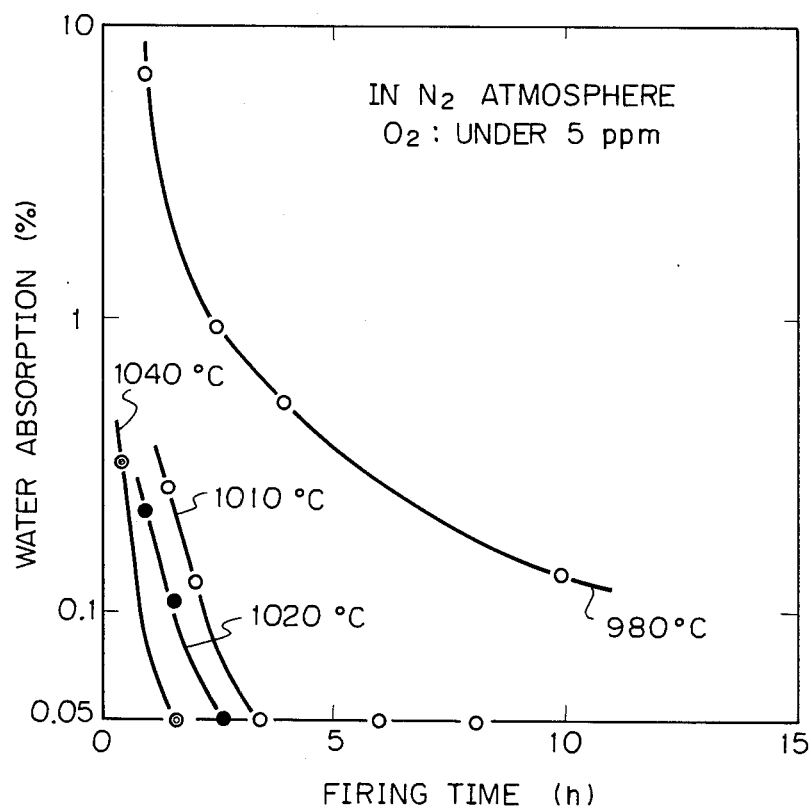
FIG. 14 shows the relationship between water absorption and the firing time.
Figure 15:
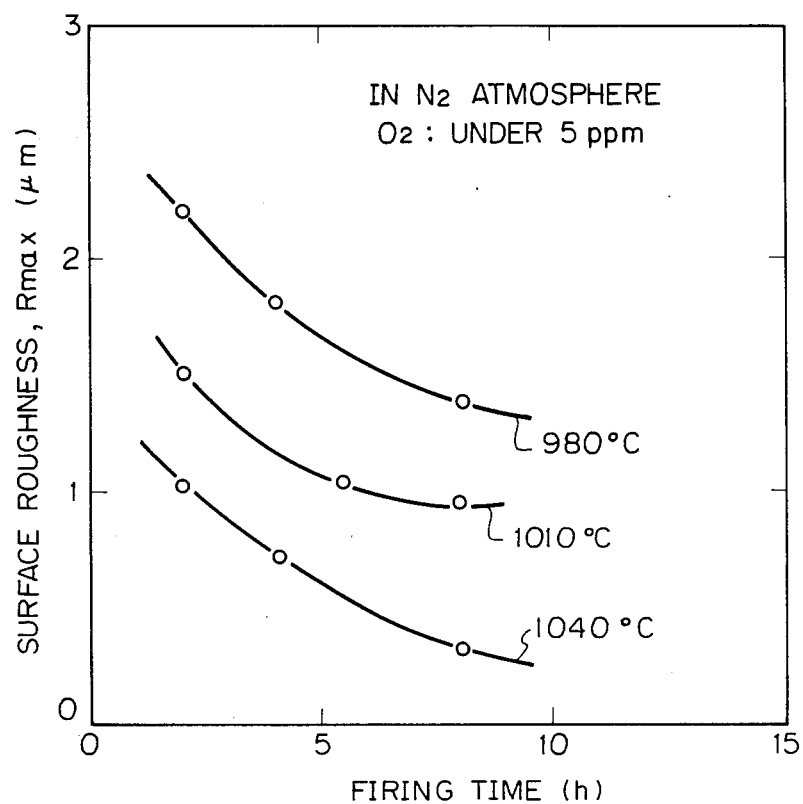
FIG. 15 shows the relationship between surface roughness and the firing time.

FIGS. 14 and 15 show the water absorption and the surface roughness when the green sheet was produced from a slurry of a glass-ceramic mixture of α-alumina, quartz glass, and borosilicate glass having an average particle size of 3 microns, respectively, after firing at various temperatures and various periods. The surface roughness Rmax was determined according to JIS B 0601 by means of a surface roughness meter.

Figure 16:
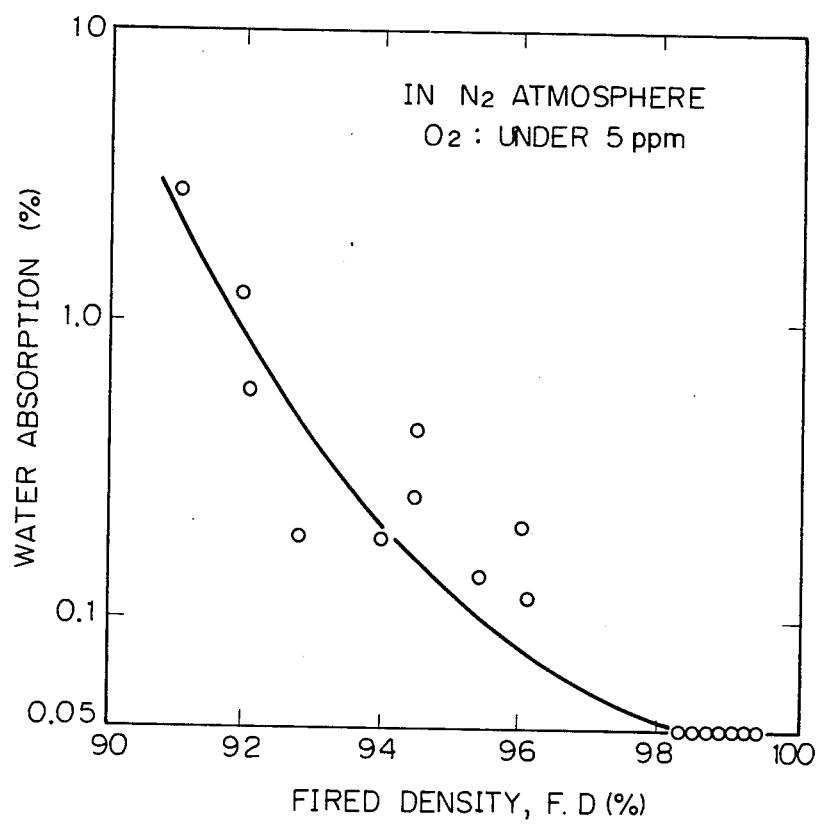
FIG. 16 shows the relationship between water absorption and the fired density.
Figure 17:
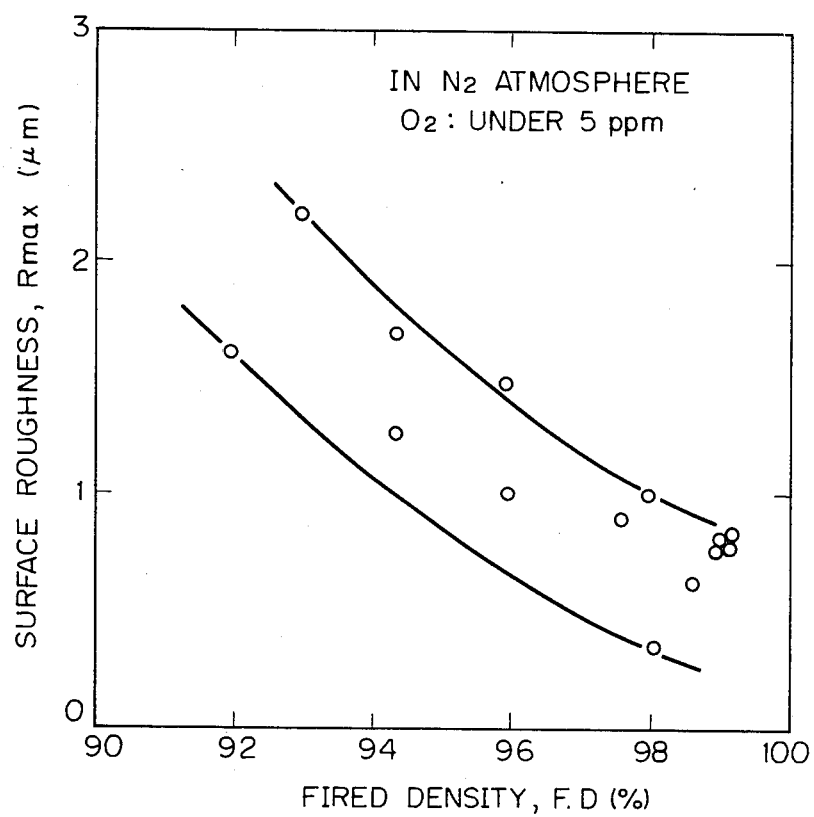
FIG. 17 shows the relationship between surface roughness and the fired density.

As can be seen from FIGS. 16 and 17, the fired density has an intimate relationship with the water absorption and the surface roughness. The surface roughness, expressed as Rmax, falls between the two curved lines drawn in FIG. 17. A fired density of more than 98 percent corresponds to less than 0.05 percent of water absorption and less than 1 micron of surface roughness Rmax.

Thus, the firing condition of a quartz-glass containing glass-ceramic is determined in the range of 1010° C. to 1040° C. for 2 to 8 hours, preferably at 1010° C. for 8 hours.

EXAMPLE 4

An 11-layered circuit structure of 2.2 mm thickness was produced by laminating green sheets, each having copper conductor layers thereon, at 130° C. under a pressure of 25 MPa, by prefiring at 800° C. for 8 hours in a nitrogen atmosphere containing water vapor so as to remove the blended binder comprising an acrylic resin and di-butyl phthalate, and thereafter by firing at 1010° C. for 8 hours in a nitrogen atmosphere without water vapor.

A 30-layered circuit structure of laminated green sheets, each having a copper conductor layer thereon, of about 6 mm was produced by the above-mentioned method.

The electrical properties of the fired copper conductor multilayered ceramic circuit boards according to the present invention are shown in Table 4 below, in comparison with two conventional circuit boards, one an α-alumina board having a molybdenum conductor II and the other an α-alumina-borosilicate glass ceramic board having a gold conductor III.

TABLE 4

Electrical Properties of Multilayered Circuit Boards

|  | I | II | III |
|---|---|---|---|
| Electrical resistivity (Ω/cm) | 0.15 | 0.8 | 0.7 |
| Dielectric constant | 4.9 | 9.8 | 5.6 |
| Dielectric strength (kV/mm) | 50 | — | 50 |
| Delay time (ps/cm) | 75 | 112 | 82 |
| Impedance (Ω) | 95 | 65 | 96 |

We claim:

1. A sinterable precursor material for a glass-ceramic insulating layer of a multilayer ceramic circuit board made up of copper conductors separated by glass-ceramic insulating layers, said material comprising a mixture of 10 percent to 75 percent by weight of α-alumina particles, 20 percent to 60 percent by weight of crystallizable or non-crystallizable glass which has a softening point in the range of approximately 750° C. to 900° C. and is sinterable at a temperature lower than the melting point of copper, and 5 percent to 70 percent by weight of quartz glass particles based on the total weight of the mixture.

2. A precursor material as set forth in claim 1 wherein said crystallizable glass comprises cordierite or spoduemene.

3. A precursor material as set forth in claim 1 wherein said non-crystallizable glass comprises borosilicate glass or aluminosilicate glass.

4. A precursor material as set forth in claim 1 comprising a mixture of approximately 34 weight percent of α-alumina, 33 weight percent of borosilicate glass and 33 weight percent of quartz glass.

5. A precursor material as set forth in claim 1 comprising a mixture of approximately 34 weight percent of α-alumina, 33 weight percent of β-spoduemene and 33 weight percent of quartz glass.

6. A green sheet for a glass-ceramic layer of a multilayer ceramic circuit board comprising an admixture of the precursor material of claim 1 and a binder.

7. A green sheet for a glass-ceramic layer of a multilayer ceramic circuit board comprising an admixture of the precursor material of claim 2 and a binder.

8. A green sheet for a glass-ceramic layer of a multilayer ceramic circuit board comprising an admixture of the precursor material of claim 3 and a binder.

9. A green sheet for a glass-ceramic layer of a multilayer ceramic circuit board comprising an admixture of the precursor material of claim 4 and a binder.

10. A green sheet for a glass-ceramic layer of a multilayer ceramic circuit board comprising an admixture of the precursor material of claim 5 and a binder.

11. A sinterable composite comprising a plurality of copper conductor layers separated by layers formed from the precursor material of claim 1.

12. A sinterable composite comprising a plurality of copper conductor layers separated by layers formed from the precursor material of claim 2.

13. A sinterable composite comprising a plurality of copper conductor layers separated by layers formed from the precursor material of claim 3.

14. A sinterable composite comprising a plurality of copper conductor layers separated by layers formed from the precursor material of claim 4.

15. A sinterable composite comprising a plurality of copper conductor layers separated by layers formed from the precursor material of claim 5.

16. A multilayer ceramic circuit board prepared by firing the composite of claim 11 in an inert atmosphere containing no water vapor at a temperature below the melting point of copper.

17. A ceramic circuit board comprising a layer of conductive material supported by a ceramic insulating layer, said board having been prepared by admixing the precursor material of claim 1 with a binder; forming a layer from the admixture; laying a conductive material on the layer to form a composite; subjecting the composite to conditions suitable for removing the binder; and thereafter firing the composite under temperature conditions suitable for causing the crystallizable or non-crystallizable glass to sinter without causing sintering of the α-alumina and quartz glass components.

18. A fired ceramic circuit board comprising a layer of a conductive material supported by a ceramic insulating layer, said insulating layer comprising 10 percent to 75 percent by weight of α-alumina particles, 20 percent to 60 percent of a sintered glass matrix composed of glass component which initially had a softening point in the range of approximately 750° C. to 900° C. and was sinterable at a temperature lower than about 1083° C., and 5 percent to 70 percent by weight of quartz glass particles, said circuit board having been fired in an inert atmosphere containing no water vapor and at a temperature above the sintering temperature of the glass component and below the sintering temperatures of α-alumina and quartz glass so as to produce a structure comprising α-alumina and quartz glass particles surrounded by said glass matrix.

19. A fired ceramic circuit board comprising a conductive layer supported by a ceramic insulating layer, said insulating layer comprising 10 percent to 75 percent by weight of α-alumina particles, 5 percent to 70 percent by weight quartz glass particles, and 20 to 60 percent by weight of a matrix of a sintered glass component surrounding said particles.

20. A fired ceramic circuit board as set forth in claim 19 wherein said ceramic insulating layer contains less than about 100 ppm residual carbon.

* * * * *